United States Patent [19]

Uchida et al.

[11] Patent Number: 5,415,889
[45] Date of Patent: May 16, 1995

[54] MANUFACTURING METHOD FOR A MAGNETIC RECORDING MEDIUM

[75] Inventors: Masatoshi Uchida; Fuminori Tokuda; Yoshihisa Osawa; Ryuji Hosogaya, all of Tokyo, Japan

[73] Assignee: TDK Corporation, Tokyo, Japan

[21] Appl. No.: 293,211

[22] Filed: Aug. 19, 1994

[30] Foreign Application Priority Data

Aug. 20, 1993 [JP] Japan .................................. 5-228350

[51] Int. Cl.[6] .............................................. H01F 10/02
[52] U.S. Cl. .................................. 427/129; 427/248.1; 427/299; 427/427
[58] Field of Search ............ 427/128, 129, 299, 248.1, 427/427

[56] References Cited

FOREIGN PATENT DOCUMENTS 62-17176  1/1987  Japan .

*Primary Examiner*—Bernard Pianalto
*Attorney, Agent, or Firm*—Oblon, Spivak, McClelland, Maier & Neustadt

[57] ABSTRACT

To manufacture a magnetic recording medium with reduced coating defects by effectively and reliably removing foreign matter that causes coating striations.

In a manufacturing method for a magnetic recording medium that includes a process in which a magnetic layer is formed on a flexible support, the aforementioned magnetic layer is formed after cleaning the aforementioned flexible support by bringing it into contact with a rotating cleaning roll, the contact surface of which consists of at least an adhesive substance or with a cleaning member, the contact surface of which consists of at least a porous polymer and so providing a manufacturing method for a magnetic recording medium in which foreign matter, which causes coating striations, can be efficiently and reliably removed and in which it is possible to manufacture a magnetic recording medium with reduced coating defects.

5 Claims, 1 Drawing Sheet

MANUFACTURING METHOD FOR A MAGNETIC RECORDING MEDIUM

BACKGROUND OF THE INVENTION

1. Field of the Invention

The present invention relates to a manufacturing method for a coated-type magnetic recording medium.

2. Discussion of Background

Magnetic recording media of this type are manufactured by a process in which the magnetic layer is formed on a flexible support. The methods for forming magnetic layers in the known art include the coating method, the vapor deposition method and the sputtering method.

The thickness of the magnetic layer, backcoating and the like in a coated-type magnetic recording medium is normally within the range of 0.3 $\mu$m to 4.0 $\mu$m. The wet layer thickness of a coating in this range at the time of application will be approximately 2 $\mu$m to 40 $\mu$m. When forming such a coated layer with a stationary-type coating method using a stationary coating device such as a nozzle, foreign matter may be present that exceeds the size of the gap between the coating device and the flexible support, which is formed from polyester films such as PET (polyethylene terephthalate) or PEN (polyethylene naphthalate), or an alamid film. Such foreign matter can become caught in the coating device causing striations in the coating. Even when it does not result in coating striations, the foreign matter may become a cause of drop-out. Therefore, in order to improve the quality of the product and the yield at the time of manufacturing, measures for removing foreign matter are of critical importance.

Also, with the vapor deposition and sputtering methods used to make the magnetic layer extremely thin and the recording density high, even minute particles of foreign matter will result in coating defects or drop-out. The foreign matter that is present on the flexible support may be introduced during production of the flexible support and may, therefore, already be present when it is delivered to the user, or the flexible support may be contaminated with foreign matter at the user's facility before the magnetic layer is formed. The composition of such foreign matter includes dust, human tissue such as dandruff, fibers and particles resulting from abrasion of the facilities.

In order to improve the quality of their products and to improve the production yield, and in particular in order to improve product quality and yield of products manufactured with methods such as stationary coating that are especially vulnerable to foreign matter, manufacturers of magnetic recording media have been looking for ways to remove any and all foreign matter from the flexible support before forming the magnetic layer, and various methods of cleaning have been tried. However, the rate at which coating striations occur is much higher in the stationary-type coating methods, compared with coating methods that utilize rotary bodies such as the reverse roll coating method and the gravure cylinder coating method. The present situation is, nevertheless, that a satisfactory result has not yet been obtained with the means for cleaning in the known art. The means for cleaning in the known art include the washing method, the wiping method using an unwoven cloth or the like, ionized air blowing and vacuum cleaning. Of these, the washing method, for example, provides good cleaning effect but with this method it is difficult to support high-speed in-line continuous cleaning, or to use it in a vacuum used in magnetic layer forming methods with vapor deposition, sputtering or the like. It is also difficult to handle situations in which there is a functional layer such as a magnetic layer, a non-magnetic layer or the like, already formed on one side. The wiping method, using an unwoven cloth or a woven cloth, presents such problems as exchange of foreign matter, as bits and pieces of the cloth tend to adhere to the layer. The ionized air blowing and vacuum cleaning methods do not provide a perfect effect in removing foreign matter either. Therefore, currently, two or more of these methods are combined to achieve the best possible result in removing foreign matter, which is still less than satisfactory.

SUMMARY OF THE INVENTION

It is the object of the present invention to provide a manufacturing method for a magnetic recording medium in which foreign matter, which causes coating striations, can be efficiently and reliably removed and in which it is possible to manufacture a magnetic recording medium with reduced coating defects.

In order to achieve the above described object, the present invention is a manufacturing method for a magnetic recording medium that includes a process whereby a magnetic layer is formed on a flexible support, wherein the aforementioned magnetic layer is formed after cleaning the aforementioned flexible support by bringing it into contact with a rotating cleaning roll or a cleaning member, the contact surface which consists of at least a porous polymer. The cleaning stage precedes the magnetic layer coating stage.

As a result of meticulous research into methods for removing foreign matter of 3 $\mu$m or larger that tends to cause coating striations, the inventor of the present invention has discovered that the foreign matter described above can be efficiently and reliably removed by performing cleaning by bringing it into contact with the rotating roll, the contact surface of which is at least an adhesive substance. The inventor has also discovered that foreign matter can also be efficiently and reliably removed by performing cleaning by bringing it into contact with the cleaning member, the contact surface of which consists of at least a porous polymer. After this cleaning process, the magnetic layer can be formed on the flexible support without any coating striations caused by foreign matter, and a magnetic recording medium without defects can be manufactured.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings wherein.

DETAILED DESCRIPTION OF THE PREFERRED EMBODIMENTS

Figure 1:
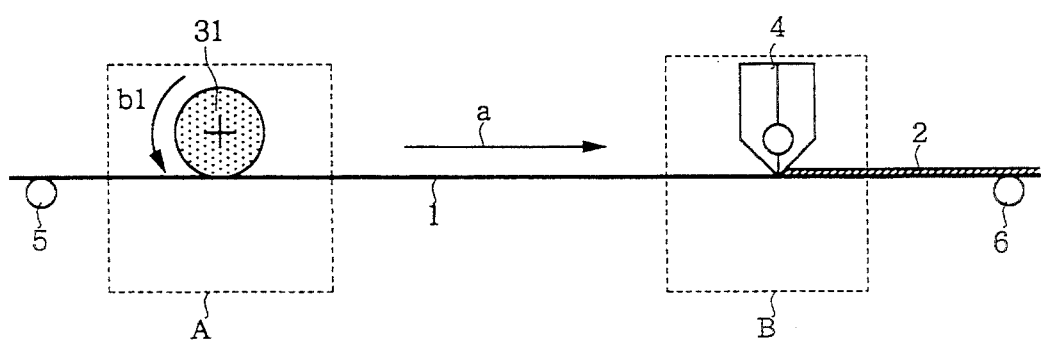
FIG. 1 illustrates the manufacturing method for a magnetic recording medium according to the present invention.
Figure 2:
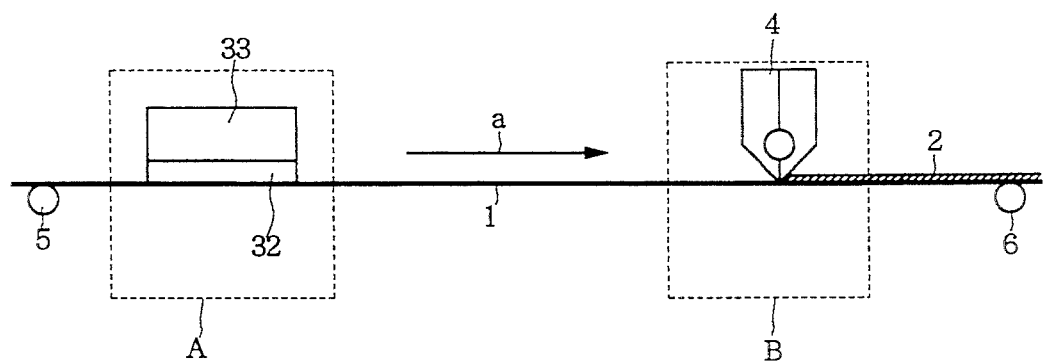
FIG. 2 illustrates another embodiment of the manufacturing method for a magnetic recording medium according to the present invention.

As shown in FIGS. 1 and 2, the present invention is a manufacturing method for a magnetic recording medium that includes a process whereby a magnetic layer 2 is formed on a flexible support 1, wherein the aforementioned magnetic layer 2 is formed after cleaning the aforementioned flexible support 1 by bringing it into contact with a rotating cleaning roll 31 or a cleaning member 32, the contact surface which consists of at least a porous polymer. The cleaning stage A precedes the magnetic layer coating stage B.

As a result of meticulous research into methods for removing foreign matter of 3 µm or larger that tends to cause coating striations, the inventor of the present invention has discovered that the foreign matter described above can be efficiently and reliably removed by performing cleaning by bringing it into contact with the rotating roll 31, the contact surface of which is at least an adhesive substance. The inventor has also discovered that foreign matter can also be efficiently and reliably removed by performing cleaning by bringing it into contact with the cleaning member 32, the contact surface of which consists of at least a porous polymer. After this cleaning process, the magnetic layer 2 can be formed on the flexible support 1 without any coating striations caused by foreign matter, and a magnetic recording medium without defects can be manufactured.

Reference number 4 indicates a stationary-type coating tool such as a nozzle and reference numbers 5 and 6 indicate rollers. The flexible support 1 runs in the direction indicated with the arrow a. Also in FIG. 1, the rotating roll 31 is rotating in the direction indicated by the arrow b1.

It is desirable to constitute the rotating roll 31 in FIG. 1 with an elastic body whose Shore hardness is within the range of 20° to 40°. It has been learned that when the rotating roll 31 is so prepared, it provides an extremely good effect in capturing foreign matter since it has good adhesion to the flexible support 1 and also it has the correct degree of tackiness. For the adhesive substance used for the rotating roll 31, it is desirable to use a vinyl-chloride resin added with a plasticizer of high molecular weight (Betaron, manufactured by Meiwa Gomu Kogyo Kabushiki Gaisha). This adhesive substance shows very little "thinning," as it is generally referred to in the rubber industry, against repeated use, including the restoration of adhesiveness after washing, and can be used stably for a long period of time. The rotating roll 31 is structured by mounting the adhesive substance onto the rotating contact surface or by forming the entire rotating roll with the adhesive substance.

In FIG. 2 the cleaning member 32 which is constituted of a porous polymer can be used in the form of either a sheet or a blade. It is possible to use the porous polymer by itself and it is also possible to provide it as a porous polymer film on an appropriate base material 33. A particularly suitable porous polymer material is polyurethane foam as it provides outstanding anti-abrasion characteristics. Specific products of the above description that are immediately available include Parupus, manufactured by Fujibou Ehime Co., Ltd. and SMT, manufactured by Beltek Co., Ltd.

For an enhanced cleaning effect, the performance in capturing foreign matter by the rotating roll 31 or the cleaning member 32 is critical. This capturing performance is a measure of the degree to which foreign matter is reliably removed from the flexible support 1 and the degree to which the foreign matter thus removed is held in the rotating roll 31 or the cleaning member 32.

In order to enhance the degree to which foreign matter is reliably removed from the flexible support 1, it is necessary to increase the adhesion between the flexible support 1 and the rotating roll 31 or the cleaning member 32. As a means for ensuring reliable adhesion, a method in which the rotating roll 31 or the cleaning member 32 is pressed against the flexible support 1 with suitable pressure is normally adopted. However, if the rotating roll 31 or cleaning member 32 is hard, sufficient contact may not be achieved even when they are pressed against the flexible support 1, or, the rotating roll 31 or the cleaning member 32 may leave scars on the flexible support 1. If the rotating roll 31 or the cleaning member 32 possesses a suitable degree of elasticity, a state of good contact can be achieved along the surface of the flexible support 1 and it is desirable that the Shore hardness be within the range of 20° to 60°. If the Shore hardness is too low (less than 20°), then the adhesive force will be too strong and the drag on the flexible support 1 itself will be excessive, and stable running of the flexible support 1 will be impaired. If the Shore hardness is too high (more than 40°), adhesiveness will not be sufficient, resulting in insufficient performance in capturing foreign matter.

As a prior art technology for cleaning with an adhesive roll, one can cite Japanese Patent Unexamined Publication 17176/1987. However, the objective of this prior art technology is to clean the rotary cam while, for example, performing vapor deposition within a vacuum. It is essentially different from the art for effectively removing foreign matter from a thin flexible support for which stable operation is required.

A porous polymer provides extremely good adhesion to the flexible support 1 with its hardness within the range of 40° to 65°. If the hardness is too high, it may leave scars on the medium and if it is too low, a sufficient cleaning effect cannot be obtained due to "settling" (permanent set-in fatigue). Polyurethane foam also has outstanding restorative force (modulus of compressive elasticity 90% or more) and provides excellent adhesion. The porousness can be freely set. There is no significant correlation between the porosity and cleaning effect, but in general, a porous polymer with a pore density of 12,000 pores/cm$^2$ or thereabouts is used.

The rotating roll 31 described earlier and the cleaning member 32 constituted with a porous polymer provide sufficient cleaning effect when they are used separately. However, it is possible to use them in combination and this brings about achievement of even greater cleaning effect.

In the embodiments 1 to 9 shown in Table I and reference examples 1 to 6 shown in Table II, the surface of the flexible support was cleaned in a preceding stage, before coating with a coat whose solid density is 28% on to the flexible support, which is formed from a 75 µm polyester (PET) film, using die nozzle in such a manner that the dry thickness of it is 1 µm. In reference example 7 (Table II), no cleaning was performed before a similar coating was applied. The details of the coating method employed, the cleaning conditions and the number of coating striations that resulted are shown in Tables I and II.

TABLE I

| | COATING METHOD | CLEANING CONDITIONS | | | | NUMBER OF STRIATIONS |
|---|---|---|---|---|---|---|
| 1 | Die nozzle | Adhesive roll | Betaron | Hardness 20° | | 0.4 |
| 2 | Die nozzle | Adhesive roll | Betaron | Hardness 25° | | 0.7 |
| 3 | Die nozzle | Adhesive roll | Betaron | Hardness 30° | | 0.4 |
| 4 | Die nozzle | Adhesive roll | Betaron | Hardness 35° | | 0.8 |
| 5 | Die nozzle | Adhesive roll | Betaron | Hardness 40° | | 1.3 |
| 6 | Die nozzle | Urethane foam | Parupus | Hardness 62° | Density 0.44 g/cm$^3$ | 0.5 |
| 7 | Die nozzle | Urethane foam | Parupus | Hardness 62° | Density 0.37 g/cm$^3$ | 0.5 |
| 8 | Die nozzle | Urethane foam | Parupus | Hardness 62° | Density 0.42 g/cm$^3$ | 0.8 |
| 9 | Die nozzle | Adhesive roll | Betaron | Hardness 30° | | 0.2 |
| | Die nozzle | Urethane foam | Parupus | Hardness 62° | Density 0.44 g/cm$^3$ | |

TABLE II

| | COATING METHOD | CLEANING CONDITIONS | | | | NUMBER OF STRIATIONS |
|---|---|---|---|---|---|---|
| 1 | Die nozzle | Adhesive roll | Betaron | Hardness 15° | | uneven coating |
| 2 | Die nozzle | Adhesive roll | Betaron | Hardness 45° | | 5.3 |
| 3 | Die nozzle | Urethane foam | Parupus | Hardness 68° | Density 0.43 g/cm$^3$ | scarring |
| 4 | Die nozzle | Urethane foam | Parupus | Hardness 38° | Density 0.39 g/cm$^3$ | 5.5 |
| 5 | Die nozzle | Unwoven cloth | Bileen Co. Ltd. | 0X1355 | (200 μm thick) | 7.4 |
| 6 | Die nozzle | Thin thread woven cloth | | Toray Co. Ltd. | Miraculation | 8.2 |
| 7 | Die nozzle | No cleaning | | | | 12.3 |

In the tables above, the number of striations refers to average values when the coating is applied to both sides at a width of 550 mm and a length of 2000 m. The hardness was measured with a Shore hardness gauge and the densities are in conformance with JIS K6505. The Betaron manufactured by Meiwa Gomu Kogyo Co. Ltd. was used for the adhesive roll and the Parpus manufactured by Fujibou Ehime Co. Ltd. was used for the urethane foam.

As is obvious from the Tables I and II shown above, among all the rotating rolls, those constituted with an elastic body with a Shore hardness within the range of 20° to 40° achieve extremely good effect in capturing foreign matter. It is deduced that this is because of good adhesion between the rotating rolls and the flexible support and also because they have an appropriate degree of tackiness.

Of all the cleaning members constituted with a porous polymer, the polymer with its hardness within the range of 40° to 65° showed exceptionally good effect in capturing foreign matter. It is deduced that this is because, within this hardness range, good adhesion with the flexible support is achieved. When the hardness exceeds the value given above, the cleaning member scars the flexible support and if the hardness is too low, satisfactory effect is not achieved due to "permanent set-in fatigue." This technology, in which cleaning is performed by employing a porous polymer, can be applied in cleaning floppy disks and the like in which a porous polymer sheet is mounted on the inner surface of a floppy disk to be used as a cleaning member.

While the invention has been particularly shown and described with reference to prefered embodiments, thereof, it will be understood by those skilled in the art that various changes in form and detail may be made therein without departing from the spirit, scope and teaching of the invention.

What is claimed is:

1. A manufacturing method for a magnetic recording medium that includes a process in which a magnetic layer is formed on a flexible support wherein:
    said magnetic layer is formed after cleaning said flexible support by bringing said flexible support into contact with a rotating cleaning roll with its contact surface consisting of at least an adhesive substance, or with a cleaning member with its contact surface consisting of at least a porous polymer.

2. A manufacturing method for a magnetic recording medium according to claim 1 wherein:
    the Shore hardness of said adhesive substance of said rotating cleaning roll is within the range of 20° to 40°.

3. A manufacturing method for a magnetic recording medium according to claim 2 wherein:
    said adhesive substance is prepared by adding a plasticizer of high molecular weight to a vinyl-chloride resin.

4. A manufacturing method for a magnetic recording medium according to claim 1 wherein:
    said porous polymer is polyurethane foam.

5. A manufacturing method for a magnetic recording medium according to claim 1 wherein:
    said magnetic film coating is formed by way of a nozzle.

* * * * *